(12) United States Patent
Chang

(10) Patent No.: US 12,119,315 B2
(45) Date of Patent: Oct. 15, 2024

(54) CHIP BONDING METHOD AND SEMICONDUCTOR CHIP STRUCTURE

(71) Applicant: CHANGXIN MEMORY TECHNOLOGIES, INC., Hefei (CN)

(72) Inventor: Chih-Wei Chang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 330 days.

(21) Appl. No.: 17/650,851

(22) Filed: Feb. 13, 2022

(65) Prior Publication Data

US 2023/0011840 A1    Jan. 12, 2023

Related U.S. Application Data

(63) Continuation of application No. PCT/CN2021/110002, filed on Aug. 2, 2021.

(30) Foreign Application Priority Data

Jul. 9, 2021    (CN) .......................... 202110777040.7

(51) Int. Cl.
*H01L 21/768*    (2006.01)
*H01L 23/00*    (2006.01)
(Continued)

(52) U.S. Cl.
CPC ........ *H01L 24/05* (2013.01); *H01L 21/76898* (2013.01); *H01L 23/481* (2013.01); *H01L 24/03* (2013.01); *H01L 24/08* (2013.01); *H01L 24/80* (2013.01); *H01L 25/0657* (2013.01); *H01L 2224/03622* (2013.01);
(Continued)

(58) Field of Classification Search
CPC .. H01L 24/05; H01L 23/481; H01L 21/76898
See application file for complete search history.

(56) References Cited

U.S. PATENT DOCUMENTS 7,168,623 B1 *    1/2007    Royer .............. G06K 19/07718
                                                    235/487
10,283,493 B1    5/2019    Nishida
(Continued)

FOREIGN PATENT DOCUMENTS

| CN | 105789069 A | 7/2016 |
| CN | 105185719 B | 4/2018 |
| CN | 111566816 A | 8/2020 |

*Primary Examiner* — Dale E Page
*Assistant Examiner* — Wilner Jean Baptiste
(74) *Attorney, Agent, or Firm* — Syncoda LLC; Feng Ma

(57) ABSTRACT

A chip bonding method includes the following operations. A first chip is provided, which includes a first contact pad including a first portion lower than a first surface of a first substrate and a second portion higher than the first surface of the first substrate to form the stepped first contact pad. A second chip is provided, which includes a second contact pad including a third portion lower than a third surface of a second substrate and a fourth portion higher than the third surface of the second substrate to form the stepped second contact pad. The first chip and the second chip are bonded. The first portion of the first chip contacts with the fourth portion of the second chip, and the second portion of the first chip contacts with the third portion of the second chip.

14 Claims, 16 Drawing Sheets

(51) Int. Cl.
*H01L 23/48* (2006.01)
*H01L 25/065* (2023.01)

(52) U.S. Cl.
CPC ............... *H01L 2224/05009* (2013.01); *H01L 2224/05011* (2013.01); *H01L 2224/05014* (2013.01); *H01L 2224/05015* (2013.01); *H01L 2224/05017* (2013.01); *H01L 2224/05073* (2013.01); *H01L 2224/0801* (2013.01); *H01L 2224/08055* (2013.01); *H01L 2224/08056* (2013.01); *H01L 2224/08059* (2013.01); *H01L 2224/0807* (2013.01); *H01L 2224/08147* (2013.01); *H01L 2224/08148* (2013.01); *H01L 2224/80895* (2013.01); *H01L 2225/06524* (2013.01); *H01L 2225/06544* (2013.01); *H01L 2225/06548* (2013.01)

(56) References Cited

U.S. PATENT DOCUMENTS

2019/0385982 A1* 12/2019 Lee ..................... H01L 24/09
2021/0320118 A1   10/2021 Zhang et al.

* cited by examiner

CHIP BONDING METHOD AND SEMICONDUCTOR CHIP STRUCTURE

CROSS-REFERENCE TO RELATED APPLICATIONS

This is a continuation of International Patent Application No. PCT/CN2021/110002 filed on Aug. 2, 2021, which claims priority to Chinese Patent Application No. 202110777040.7 filed on Jul. 9, 2021. The disclosures of these applications are hereby incorporated by reference in their entirety.

BACKGROUND

Stacking a plurality of chips and establishing mechanical and electrical connections during the manufacturing of an integrated circuit is an important way to reduce the volume of the integrated circuit. In the practice, Through Silicon Vias (TSVs) are firstly manufactured on various chips needing to be stacked, a contact pad of each TSV is then formed, and positioning bonding is finally performed in a chip-to-chip or chip-to-wafer manner. An upper chip and a lower chip can be electrically connected using the contact pads and the TSVs.

SUMMARY

The present disclosure relates to, but is not limited to, a chip bonding method and a semiconductor chip structure.

According to a first aspect of the embodiments of the present disclosure, a chip bonding method is provided. The method includes operations as follows.

A first chip is provided. The first chip includes a first substrate including a first surface and a second surface which are arranged to be opposite. The first chip further includes a first groove on a side of the first surface of the first substrate, and a first contact pad in the first groove; the first contact pad includes a first portion and a second portion. The first portion is lower than the first surface of the first substrate, and the second portion is higher than the first surface of the first substrate, so as to form the first contact pad which is stepped.

A second chip is provided. The second chip includes a second substrate including a third surface and a fourth surface which are arranged to be opposite. The second chip further includes a second groove on a side of the third surface of the second substrate, and a second contact pad in the second groove; the second contact pad includes a third portion and a fourth portion. The third portion is lower than the third surface of the second substrate, the fourth portion is higher than the third surface of the second substrate, so as to form the second contact pad which is stepped.

The first chip and the second chip are bonded, the first portion of the first chip contacts with the fourth portion of the second chip, and the second portion of the first chip contacts with the third portion of the second chip.

According to a second aspect of the embodiments of the present disclosure, a semiconductor chip structure is provided. The semiconductor chip structure includes a first chip and a second chip.

The first chip includes a first substrate including a first surface and a second surface which are arranged to be opposite. The first chip further includes a first groove on a side of the first surface of the first substrate, and a first contact pad in the first groove.

The second chip includes a second substrate including a third surface and a fourth surface which are arranged to be opposite. The second chip further includes a second groove on a side of the third surface of the second substrate, and a second contact pad in the second groove.

The first contact pad of the first chip contacts with the second contact pad of the second chip, and a gap is formed between the first contact pad and the second contact pad.

REFERENCE NUMERALS

Figure 1A:
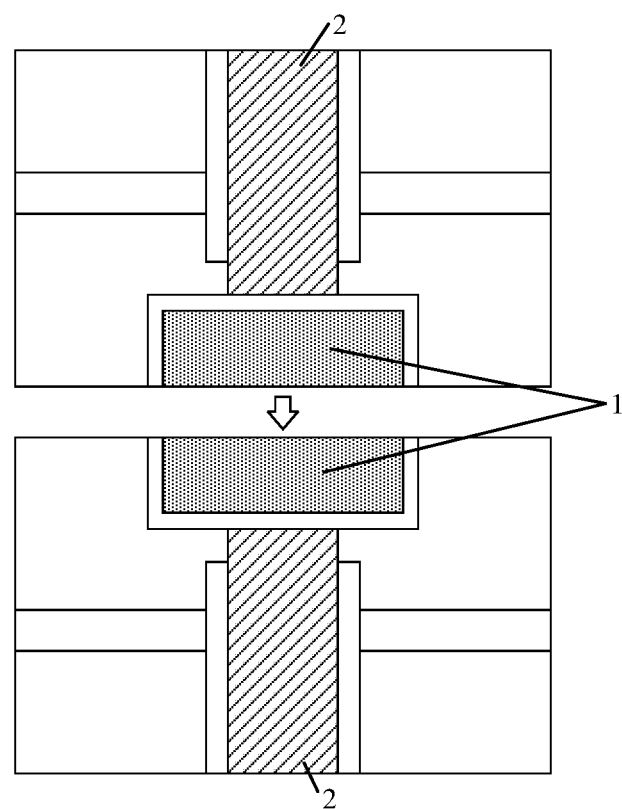
FIG. 1A is a schematic diagram of a bonding process of a semiconductor chip structure in some implementations.

1: contact pad; 2: through hole structure;
10: first substrate; 101: first base plate; 102: first dielectric layer; 103: first groove; 104: first surface; 105: second surface;
11: first through hole structure; 111: first conductive layer; 112: first insulating layer;
12: first contact pad pre-layer; 120: first contact pad; 121: first portion; 122: second portion;
13: first mask layer;

20: second substrate; 201: second base plate; 202: second dielectric layer; 204: third surface; 205: fourth surface; 21: second through hole structure; 211: second conductive layer; 212: second insulating layer; 220: second contact pad; 221: third portion; 222: fourth portion; 30: gap.

DETAILED DESCRIPTION

Exemplary implementations disclosed herein are described in more detail below with reference to the accompanying drawings. While the exemplary implementations of the present disclosure are shown in the drawings, it should be understood that the present disclosure may be implemented in various forms and should not be limited to specific implementations set forth herein. Rather, these implementations are provided so that the present disclosure will be understood thoroughly, and the disclosure scope of the present disclosure can be completely conveyed to those skilled in the art.

In the following description, numerous specific details are set forth in order to provide a more thorough understanding of the present disclosure. However, it will be apparent to those skilled in the art that the present disclosure may be practiced without one or more of these specific details. In other examples, some technical features that are well known in the art have not been described in order to avoid obscuring the present disclosure. That is, not all features of an actual embodiment are described herein, and well-known functions and structures are not described in detail.

In the drawings, the dimensions of layers, regions, elements, and their relative dimensions may be exaggerated for clarity. The same reference numerals refer to the same elements throughout.

It should be understood that when an element or layer is referred to as being "on", "adjacent to", "connected to", or "coupled to" another element or layer, the element or layer be directly on, adjacent to, connected to, or coupled to the other element or layer, or intervening elements or layers may be present. In contrast, when an element is referred to as being "directly on", "directly adjacent to", "directly connected to", or "directly coupled to" another element or layer, there are no intervening elements or layers present. It should be understood that although the terms first, second, third, etc. may be used to describe various elements, components, regions, layers, and/or portions, these elements, components, regions, layers, and/or portions should not be limited by these terms. These terms are used merely to distinguish one element, component, region, layer, or portion from another element, component, region, layer, or portion. Therefore, a first element, component, region, layer, or portion discussed below may be represented as a second element, component, region, layer, or portion without departing from the teachings of the present disclosure. When a second element, component, region, layer, or portion is discussed, it is not indicated that a first element, component, region, layer, or portion is necessarily present in the present disclosure.

Spatially relational terms such as "below", "under", "lower", "beneath", "above", and "upper" may be used herein for convenience of description to describe a relationship between one element or feature and another element or feature illustrated in the figures. It should be understood that in addition to the orientation shown in the figures, the spatially relational terms are intended to further include different orientations of devices in use and operation. For example, if the devices in the figures are turned over, elements or features described as being "under" or "beneath" or "below" other elements or features will be oriented to be "on" the other elements or features. Therefore, the exemplary terms "under" and "below" may include both upper and lower orientations. The device may be otherwise oriented (rotated by 90 degrees or in other orientations) and the spatial descriptors used herein may be interpreted accordingly.

The terms used herein are for the purpose of describing particular embodiments only and are not intended to be limiting of the present disclosure. As used herein, the singular forms "a/an", "one", and "the" are also intended to include the plural forms as well, unless the context clearly dictates otherwise. It should also be understood that when the terms "composed of" and/or "including" are used in this specification, the presence of the features, integers, steps, operations, elements, and/or components is determined, but the presence or addition of one or more other features, integers, steps, operations, elements, components, and/or groups is also possible. As used herein, the term "and/or" includes any and all combinations of the associated listed items.

For a thorough understanding of the present disclosure, detailed operations and detailed structures will be set forth in the following description in order to explain the technical solutions of the present disclosure. The preferred embodiments of the present disclosure are described in detail below. However, the present disclosure may also have other implementations in addition to these detailed descriptions.

At present, how to realize wafer or chip bonding with high efficiency and high quality is an important research direction.

Figure 1B:
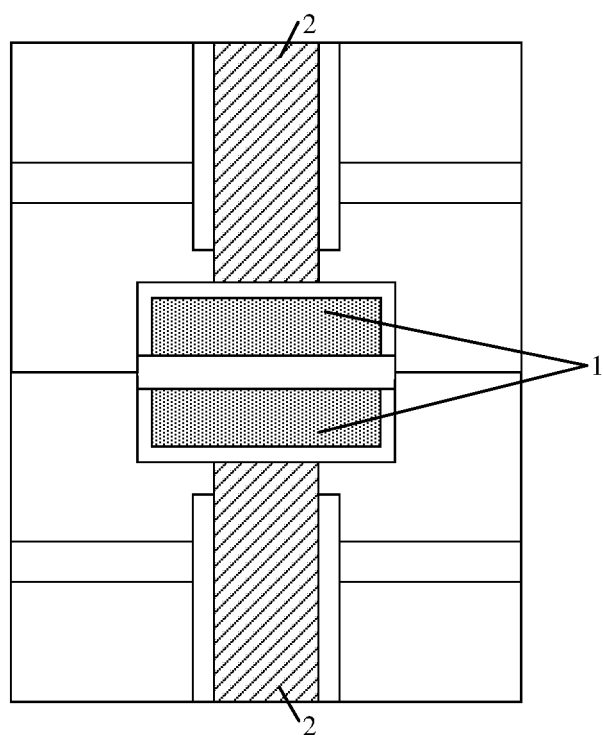
FIG. 1B is a schematic cross-sectional view of a semiconductor chip structure in some implementations.
Figure 1C:
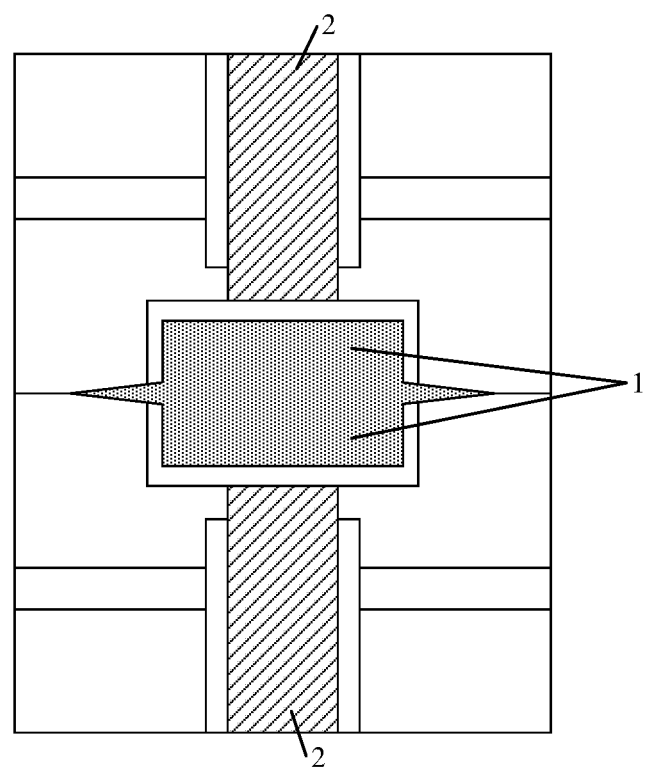
FIG. 1C is a schematic cross-sectional view of a semiconductor chip structure in some implementations.

In some implementations, FIG. 1A is a schematic diagram of a bonding process of a semiconductor chip structure in some implementations. The depth of a contact surface of a contact pad 1 needs to be controlled when a chip is subjected to hybrid bonding. However, it is quite difficult to control the depth of the contact pad 1 within a range of 1 nm to 5 nm. A backside through hole exposure device manufacturing process of a through hole structure 2 is susceptible to backside CMP control stability problems, resulting in connection problems between the contact pads 1 of two chips during hybrid bonding. For example, as shown in FIG. 1B, the depth of the contact pad 1 is too large, resulting in an open circuit between the contact pads; or, as shown in FIG. 1C, the depth of the contact pad 1 is too small, and materials in the contact pads are extruded from a bonding surface, resulting in bonding separation or contact with the adjacent contact pads to form a short circuit.

Figure 2:
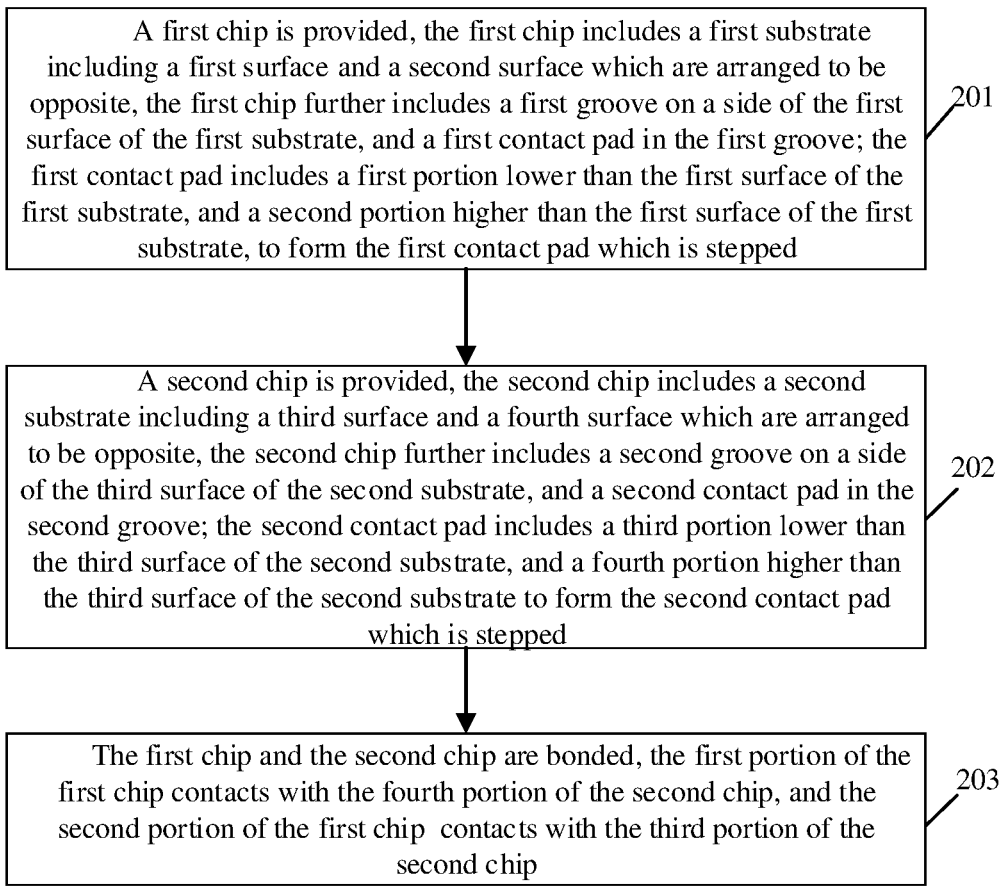
FIG. 2 is a schematic flowchart of a chip bonding method provided by an embodiment of the present disclosure.

Based on this, an embodiment of the present disclosure provides a chip bonding method. Referring specifically to FIG. 2, as shown in the figure, the method includes the following operations.

At 201, a first chip is provided. The first chip includes a first substrate including a first surface and a second surface which are arranged to be opposite. The first chip further includes a first groove on a side of the first surface of the first substrate, and a first contact pad in the first groove. The first contact pad includes a first portion and a second portion. The first portion is lower than the first surface of the first substrate, and the second portion is higher than the first surface of the first substrate to form the first contact pad which is stepped.

At 202, a second chip is provided. The second chip includes a second substrate including a third surface and a fourth surface which are arranged to be opposite, the second chip further includes a second groove on a side of the third surface of the second substrate, and a second contact pad in the second groove; the second contact pad includes a third portion and a fourth portion. The third portion is lower than the third surface of the second substrate, and the fourth portion is higher than the third surface of the second substrate to form the second contact pad which is stepped.

At 203, the first chip and the second chip are bonded, the first portion of the first chip contacts with the fourth portion of the second chip, the second portion of the first chip contacts with the third portion of the second chip, and a gap is formed between the first contact pad and the second contact pad.

The chip bonding method provided by the embodiment of the present disclosure will be described in further detail with reference to specific embodiments.

FIGS. 3A to 3H are schematic diagrams of device structures in a bonding process of a chip bonding method provided by an embodiment of the present disclosure.

First, as shown in FIGS. 3A to 3F, operation 201 is performed to provide a first chip.

In an embodiment, the first chip includes a first substrate 10. Here, the first substrate may be an elemental semiconductor material substrate (e.g., a Silicon (Si) substrate or a Germanium (Ge) substrate), a composite semiconductor material substrate (e.g., a Silicon Germanium (SiGe) substrate), or a Silicon-on-Insulator (SOI) substrate, a Germanium-on-Insulator (GeOI) substrate, etc.

Figure 3A:
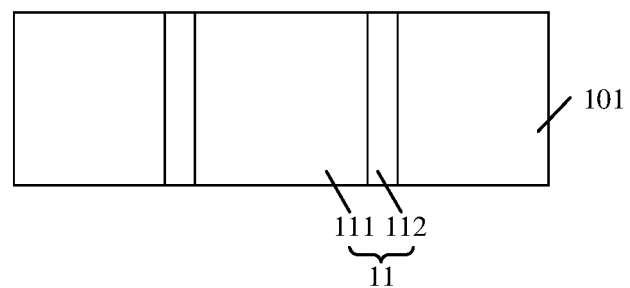
FIG. 3A is a schematic diagram of a device structure in a bonding process of a chip bonding method provided by an embodiment of the present disclosure.

Referring first to FIG. 3A, the first substrate 10 includes a first base plate 101, and a first through hole structure 11 penetrating through the first base plate 101.

In practice, the method further includes the following operation. Before forming the first through hole structure 11 penetrating through the first base plate 101, a lower surface of the first base plate 101 is polished to thin the first base plate 101.

Then, the first base plate 101 is etched from an upper surface of the first base plate 101 to form a first through hole (not shown in the figure).

Specifically, a mask layer may be first grown on the upper surface of the first base plate 101 and then patterned to display a first through hole pattern to be etched on the mask layer. The mask layer may be patterned by a photoetching process. The mask layer may be a photoresist mask or a hard mask patterned based on a photoetching mask. When the mask layer is a photoresist mask, the mask layer is patterned specifically by exposure, development, and stripping. A first through hole penetrating through the first base plate is then etched according to a through hole pattern to be etched.

Then, a first insulating layer 112 is formed on a side wall of the first through hole. The material of the first insulating layer 112 may include, but is not limited to, an associated integrated circuit insulating material such as silicon oxide or silicon nitride.

And then, after the first insulating layer is formed, a barrier layer and a seed layer (not shown in the figure) are sequentially formed. The barrier layer is made of one or any combination of Ta, TaN, Ti, and TiN, and the seed layer is made of copper and has a thickness ranges from 1 nm to 10 nm. A side wall of the first insulating layer 112 is filled with a conductive material to form a first conductive layer 111 penetrating through the first base plate 101. The material of the first conductive layer 111 may include an associated integrated circuit conductive material such as copper or tungsten.

Figure 3B:
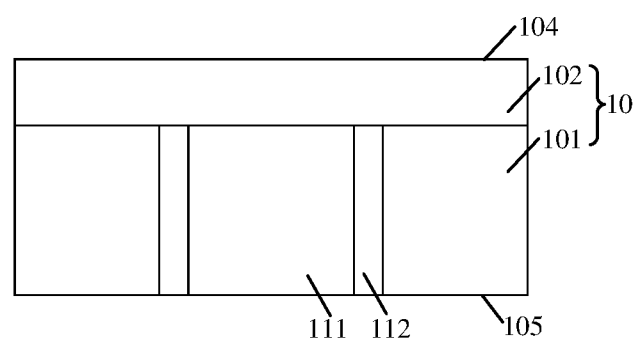
FIG. 3B is a schematic diagram of a device structure in a bonding process of a chip bonding method provided by an embodiment of the present disclosure.

Then, referring to FIG. 3B, a first dielectric layer 102 covering upper surfaces of the first base plate 101 and the first through hole structure 11 is formed. The first base plate 101 and the first dielectric layer 102 constitute the first substrate 10.

The first substrate 10 includes a first surface 104 and a second surface 105 which are arranged to be opposite. The first surface is an upper surface of the first dielectric layer 102, and the second surface is the lower surface of the first base plate 101.

Figure 3C:
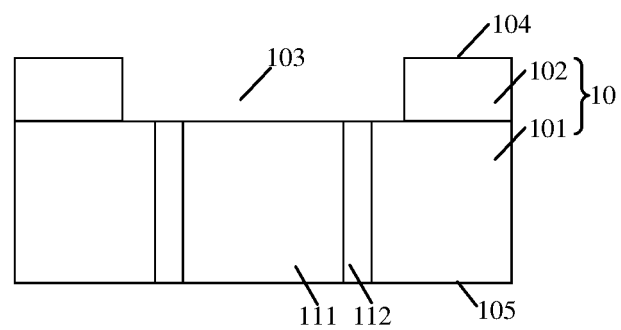
FIG. 3C is a schematic diagram of a device structure in a bonding process of a chip bonding method provided by an embodiment of the present disclosure.

Then, referring to FIG. 3C, the first substrate 10 is etched to form a first groove 103. The first groove 103 is disposed above the first through hole structure 11.

In an embodiment, the operation of etching the first substrate 10 to form a first groove 103 specifically includes the following operation. The first dielectric layer 102 is etched to form a first groove 103.

In another embodiment, instead of forming the first dielectric layer, the first base plate 101 may be etched directly to form a first groove that exposes the first through hole structure. Specifically, the operation of etching the first base plate to form a first groove includes the following operation. A part of the first base plate and a part of the first through hole structure are etched off from the upper surface of the first base plate to form a first groove.

In this embodiment, the first surface is the upper surface of the first base plate 101, and the second surface is the lower surface of the first base plate 101.

Figure 3D:
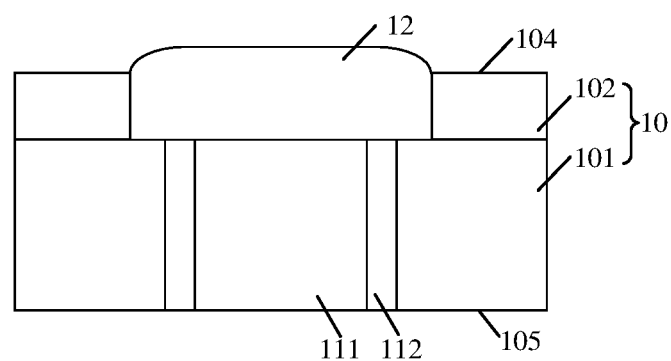
FIG. 3D is a schematic diagram of a device structure in a bonding process of a chip bonding method provided by an embodiment of the present disclosure.

Then, referring to FIG. 3D, the first groove 103 is filled to form a first contact pad pre-layer 12.

In practice, the first contact pad pre-layer 12 may be formed by sputtering or electroplating, etc.

An upper surface of the first contact pad pre-layer 12 is higher than the first surface 104 of the first substrate 10.

Figure 3E:
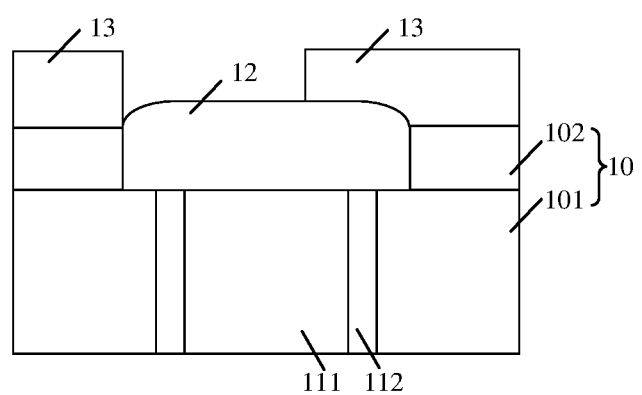
FIG. 3E is a schematic diagram of a device structure in a bonding process of a chip bonding method provided by an embodiment of the present disclosure.
Figure 3F:
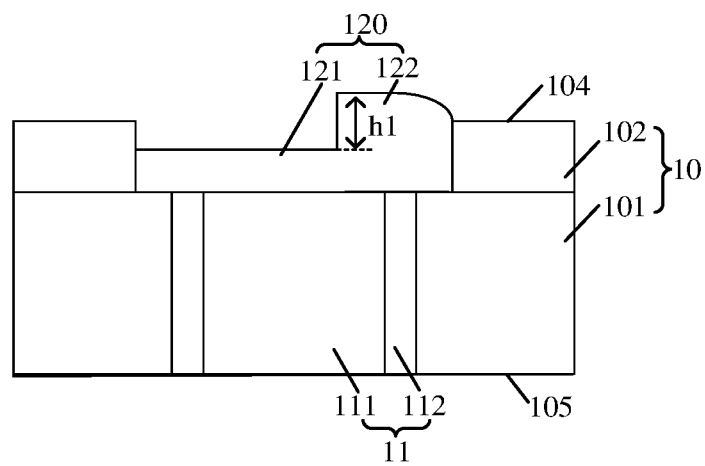
FIG. 3F is a schematic diagram of a device structure in a bonding process of a chip bonding method provided by an embodiment of the present disclosure.

Then, referring to FIG. 3E and FIG. 3F, a part of the first contact pad pre-layer 12 is etched to form a first contact pad 120.

Specifically, a first mask layer 13 may be first grown on the first surface 104 of the first substrate 10 and a part of the first contact pad pre-layer 12. The first mask layer 13 is then patterned to expose a first contact pad pattern to be removed on the first mask layer 13. The first mask layer may be patterned by a photoetching process. The first mask layer may be a photoresist mask or a hard mask patterned based on a photoetching mask. When the first mask layer is a photoresist mask, the first mask layer is patterned specifically by exposure, development, and stripping. The first contact pad 120 is then etched according to the first contact pad pattern to be etched.

Here, the first contact pad 120 may be formed using, for example, a wet or dry etching process.

Finally, the first mask layer 13 is removed to form a first chip.

The first chip includes a first groove 103 on a side of the first surface 104 of the first substrate 10, and a first contact pad 120 in the first groove 103. The first contact pad 120 includes a first portion 121 and a second portion 122. The first portion 121 is lower than the first surface 104 of the first substrate 10, and the second portion 122 is higher than the first surface 104 of the first substrate 10, to form the first contact pad 120 which is stepped.

Figure 3G:
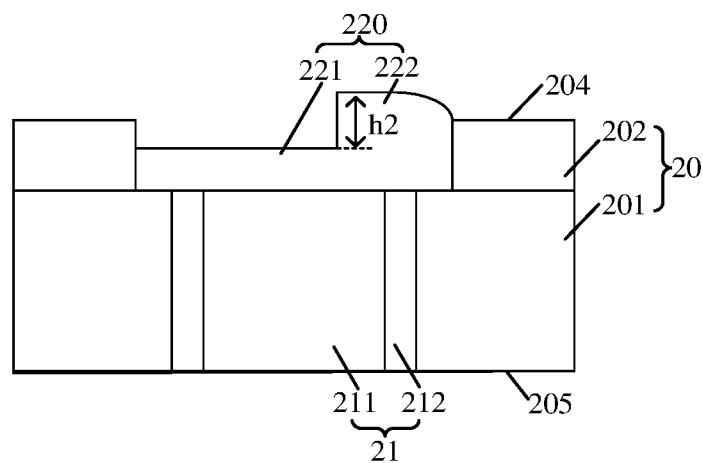
FIG. 3G is a schematic diagram of a device structure in a bonding process of a chip bonding method provided by an embodiment of the present disclosure.

Then, as shown in FIG. 3G, operation 202 is performed to provide a second chip.

It should be noted that the manufacturing operations of the first chip and the second chip are substantially the same before bonding the first chip and the second chip. Therefore, only the manufacturing operations of the first chip are shown in FIGS. 3A to 3F, and the manufacturing operations of the second chip may be referred to as schematic diagrams of the first chip.

In an embodiment, the second chip includes a second substrate 20. Here, the second substrate may be an elemental semiconductor material substrate (e.g., a Si substrate or a Ge substrate), a composite semiconductor material substrate (e.g., a SiGe substrate), or an SOI substrate, a GeOI substrate, etc.

The second substrate 20 includes a second base plate 201, and a second through hole structure 21 penetrating through the second base plate 201.

In practice, the method further includes the following operations. Before forming the second through hole structure 21 penetrating through the second base plate 201, a lower surface of the second base plate 201 is polished to thin the second base plate 201.

Then, the second base plate 201 is etched from an upper surface of the second base plate 201 to form a second through hole.

Specifically, a mask layer may be first grown on the upper surface of the second base plate 201 and then patterned to display a second through hole pattern to be etched on the mask layer. The mask layer may be patterned by a photoetching process. The mask layer may be a photoresist mask or a hard mask patterned based on a photoetching mask. When the mask layer is a photoresist mask, the mask layer is patterned specifically by exposure, development, and stripping. A second through hole penetrating through the second base plate is then etched according to a through hole pattern to be etched.

Then, a second insulating layer 212 is formed on a side wall of the second through hole. The material of the second insulating layer 212 may include, but is not limited to, an associated integrated circuit insulating material such as silicon oxide or silicon nitride.

And then, after the second insulating layer is formed, a barrier layer and a seed layer (not shown in the figure) are sequentially formed. The barrier layer is made of one or any combination of Ta, TaN, Ti, and TiN, and the seed layer is made of copper and has a thickness ranges from 1 nm to 10 nm. A side wall of the second insulating layer 212 is filled with a conductive material to form a second conductive layer 211 penetrating through the second base plate 201. The material of the second conductive layer 211 may include an associated integrated circuit conductive material such as copper or tungsten.

Then, a second dielectric layer 202 covering upper surfaces of the second base plate 201 and the second through hole structure 21 is formed.

The second substrate 20 includes a third surface 204 and a fourth surface 205 which are arranged to be opposite. The third surface is an upper surface of the second dielectric layer 202, and the fourth surface is the lower surface of the second base plate 201.

Then, the second substrate 20 is etched to form a second groove disposed above the second through hole structure 21.

In an embodiment, the operation of etching the second substrate 20 to form a second groove specifically includes the following operation. The second dielectric layer 202 is etched to form a second groove.

In another embodiment, instead of forming the second dielectric layer, the second base plate 201 may be etched directly to form a second groove that exposes the second through hole structure. Specifically, the operation of etching the second base plate to form a second groove includes the following operation. A part of the second base plate and a part of the second through hole structure are etched off from the upper surface of the second base plate to form a second groove.

In this embodiment, the third surface is the upper surface of the second base plate 201, and the fourth surface is the lower surface of the second base plate 201.

Then, the second groove is filled to form a second contact pad pre-layer.

In practice, the second contact pad pre-layer may be formed by sputtering or electroplating, etc.

An upper surface of the second contact pad pre-layer is higher than the third surface 204 of the second substrate 20.

Then, a part of the second contact pad pre-layer is etched to form a second contact pad 220.

Specifically, a second mask layer may be first grown on the third surface 204 of the second substrate 20 and a part of the second contact pad pre-layer and then patterned to display a second contact pad pattern to be etched on the second mask layer. The second mask layer may be patterned by a photoetching process. The second mask layer may be a photoresist mask or a hard mask patterned based on a photoetching mask. When the second mask layer is a photoresist mask, the second mask layer is patterned specifically by exposure, development, and stripping. The second contact pad 220 is then etched according to the second contact pad pattern to be etched.

Here, the second contact pad 220 may be formed using, for example, a wet or dry etching process.

Finally, the second mask layer is removed to form a second chip.

The second chip includes a second groove on a side of the third surface 204 of the second substrate 20, and a second contact pad 220 in the second groove. The second contact pad includes a third portion 221 and a fourth portion 222. The third portion 221 is lower than the third surface 204 of the second substrate 20, and the fourth portion 222 is higher than the third surface 204 of the second substrate 20 to form the second contact pad 220 which is stepped.

Figure 3H:
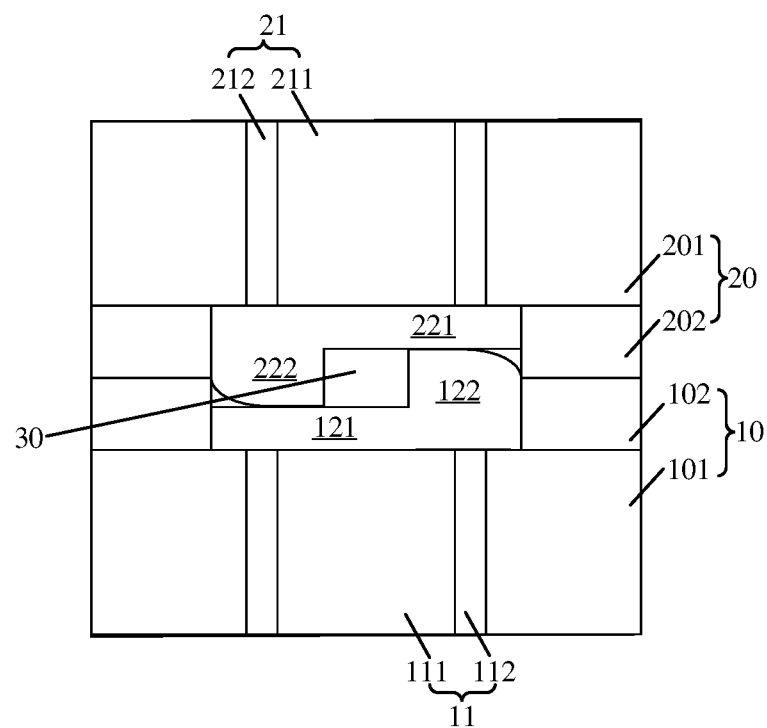
FIG. 3H is a schematic diagram of a device structure in a bonding process of a chip bonding method provided by an embodiment of the present disclosure.

Then, as shown in FIG. 3H, operation 203 is performed. The first chip and the second chip are bonded. The first portion 121 of the first chip contacts with the fourth portion 222 of the second chip, and the second portion 122 of the first chip contacts with the third portion 221 of the second chip.

According to the bonding method provided by the embodiments of the present disclosure, both the first contact pad of the first chip and the second contact pad of the second chip are designed into stepped contact pads, and the contact pads with high and low drops are used as bonding surfaces during bonding, so that an interlocking structure can be formed, displacement in the bonding process is prevented, the overall reliability is improved, and the stepped contact pads can also improve the effect of connecting two chips after bonding. In addition, compared with a narrow process window having a depth required to be controlled within 1 nm to 5 nm in some implementations, the design of the contact pads with high and low drops in the present disclosure does not need to strictly control the dimensions to a nanometer level, the process window is widened, the process difficulty is reduced, and the process efficiency and the yield are improved.

In an embodiment, the method further includes the following operation. A gap 30 is formed between the first contact pad 120 and the second contact pad 220 after bonding the first chip and the second chip.

In the embodiment of the present disclosure, a large gap can be formed between the first contact pad and the second contact pad. The gap can increase a gap buffer area of metal thermal expansion when the contact pads are bonded, thereby reducing the problem of bond delamination caused by the metal thermal expansion.

In an embodiment, a side of a part of the second portion 122 of the first contact pad 120 is arc-shaped, and the part is higher than the first surface 104 of the first substrate 10, and the side is close to the first substrate 10.

A side of a part of the fourth portion 222 of the second contact pad 220 is arc-shaped, and the part is higher than the third surface 204 of the second substrate 20, and the side is close to the second substrate 20. Therefore, compared with a right-angle shape, an arc shape can prevent the first substrate and the second substrate from being propped apart due to the characteristic that an arc-shaped structure is smooth even if expansion and extrusion occur during subsequent bonding.

Figure 5A:
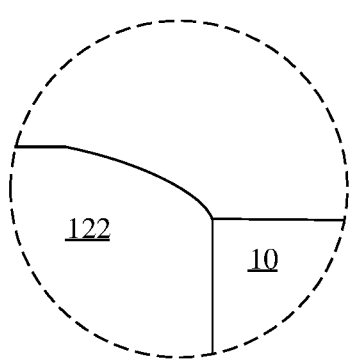
FIG. 5A is a partially enlarged view of a second portion of a first chip provided by an embodiment of the present disclosure.
Figure 5B:
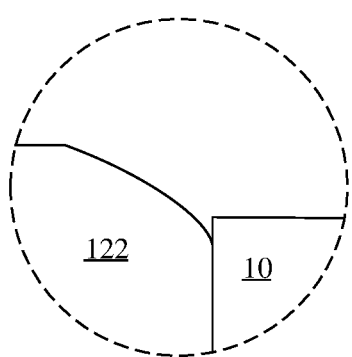
FIG. 5B is a partially enlarged view of a second portion of a first chip provided by an embodiment of the present disclosure.

FIG. 5A and FIG. 5B are partially enlarged views of a second portion of a first chip provided by an embodiment of the present disclosure.

The arc-shaped part of the second portion 122 may not extend to an inner side wall of the first substrate 10 as shown in FIG. 5A or may extend to the inner side wall of the first substrate 10 as shown in FIG. 5B. It should be noted that the shape of the fourth portion 222 is the same as that of the second portion 122.

In an embodiment, the first contact pad 120 is circular or rectangular in a projection perpendicular to a plane direction of the first substrate 10.

The second contact pad 220 is circular or rectangular in a projection perpendicular to a plane direction of the second substrate 20.

Figure 4A:
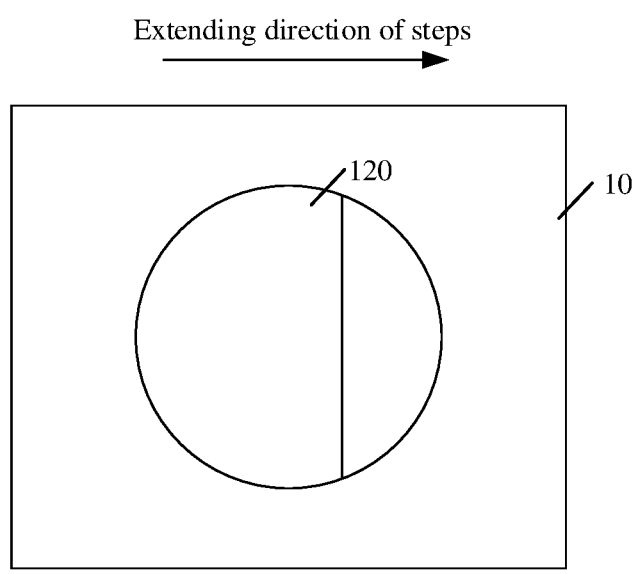
FIG. 4A is a top view of a first chip of a semiconductor chip structure provided by an embodiment of the present disclosure.
Figure 4B:
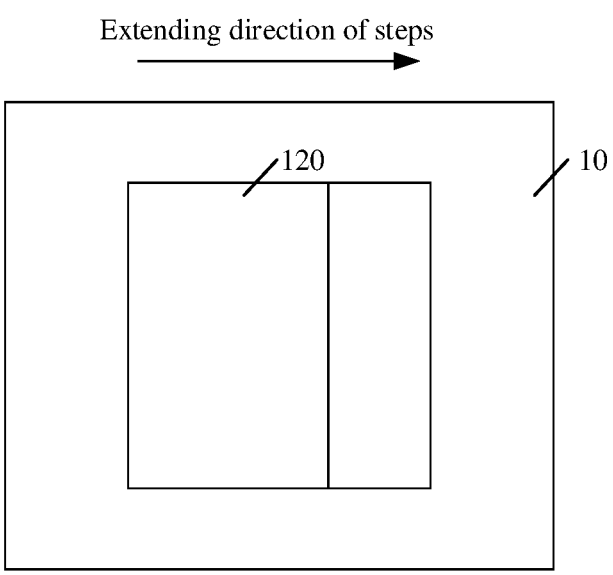
FIG. 4B is a top view of a first chip of a semiconductor chip structure provided by an embodiment of the present disclosure.

Specifically, as shown in FIG. 4A and FIG. 4B, in the embodiment shown in FIG. 4A, the first contact pad 120 is circular in the projection perpendicular to the plane direction of the first substrate 10. In the embodiment shown in FIG. 4B, the first contact pad 120 is rectangular in the projection perpendicular to the plane direction of the first substrate 10. It should be noted that the shape of the second contact pad 220 is the same as that of the first contact pad 120.

It should be noted that the first contact pad and the second contact pad may be, but are not limited to, circular or rectangular. In practice, the shapes of the first contact pad and the second contact pad may be determined by a photo-etching process.

In an embodiment, a width of the first portion 121 is larger than half of a width of the first contact pad 120 in an extending direction of steps. When the first contact pad 120 is circular, a maximum width of the first contact pad 120 is defined as the width of the first portion 121, and the maximum width of the first contact pad 120 is defined as the width of the first contact pad 120.

A width of the third portion 221 is larger than half of a width of the second contact pad 220 in the extending direction of the steps. When the second contact pad 220 is circular, a maximum width of the second contact pad 220 is defined as the width of the third portion 221, and the maximum width of the second contact pad 220 is defined as the width of the second contact pad 220.

In an embodiment, a height of a part of the second portion 122 higher than the first portion 121 ranges from 100 nm to 500 nm. Specifically, referring to FIG. 3F, a height of h1 in the figure ranges from 100 nm to 500 nm.

A height of a part of the fourth portion 222 higher than the third portion 221 ranges from 100 nm to 500 nm. Specifically, referring to FIG. 3G, a height of h2 in the figure ranges from 100 nm to 500 nm.

In an embodiment, the first chip includes a first through hole structure 11. The first through hole structure 11 is disposed in the first substrate 10, and is on a side of the second surface 105 of the first substrate 10. A projection image of the gap 30 falls within a projection image of the first through hole structure 11 in a projection perpendicular to a plane direction of the first substrate 10.

The second chip includes a second through hole structure 21. The second through hole structure 21 is disposed on the second substrate 20, and is on a side of the fourth surface 205 of the second substrate 20. The projection image of the gap 30 falls within a projection image of the second through hole structure 21 in a projection perpendicular to a plane direction of the second substrate 20.

It should be explained that a plane on which upper and lower surfaces of a substrate are disclosed or a central plane in a thickness direction in a strict sense is defined as a substrate plane.

In an embodiment, the projection image of the first through hole structure 11 falls within a projection image of the first contact pad 120 in the projection perpendicular to the plane direction of the first substrate 10.

The projection image of the second through hole structure 21 falls within a projection image of the second contact pad 220 in the projection perpendicular to the plane direction of the second substrate 20.

In an embodiment, the operation of bonding the first chip and the second chip includes the following operation. The first chip and the second chip are bonded up and down in a mirroring manner.

In an embodiment, the operation of forming the gap 30 between the first contact pad 120 and the second contact pad 220 includes the following operation. A gap 30 is formed between the second portion 122 of the first contact pad 120 and the fourth portion 222 of the second contact pad 220.

An embodiment of the present disclosures also provides a semiconductor chip structure. As shown in FIG. 3H, the semiconductor chip includes a first chip and a second chip.

The first chip includes a first substrate 10. The first substrate 10 includes a first surface 104 and a second surface 105 which are arranged to be opposite. The first chip further includes a first groove 103 on a side of the first surface 104 of the first substrate 10, and a first contact pad 120 in the first groove 103.

The second chip includes a second substrate 20. The second substrate 20 includes a third surface 204 and a fourth surface 205 which are arranged to be opposite. The second chip further includes a second groove on a side of the third surface 204 of the second substrate 20, and a second contact pad 220 in the second groove.

The first contact pad 120 of the first chip contacts with the second contact pad 220 of the second chip, and a gap 30 is formed between the first contact pad 120 and the second contact pad 220.

In an embodiment, a side of a part of the first contact pad 120 is arc-shaped, the part protrudes from the first surface 104 of the first substrate 10, and the side is close to the first substrate 10.

A side of part of the second contact pad 220 is arc-shaped, the part protrudes from the third surface 204 of the second substrate 20, and the side is close to the second substrate 20. Therefore, compared with a right-angle shape, an arc shape can prevent the first substrate and the second substrate from being propped apart due to the characteristic that an arc-shaped structure is smooth even if expansion and extrusion occur during subsequent bonding.

The arc-shaped part of the first contact pad 120 may not extend to an inner side wall of the first substrate 10 as shown in FIG. 5A or may extend to the inner side wall of the first substrate 10 as shown in FIG. 5B.

In an embodiment, the first chip further includes a first through hole structure 11. The first through hole structure 11 is disposed in the first substrate 10, and is on a side of the second surface 105 of the first substrate 10. A projection image of the gap 30 falls within a projection image of the first through hole structure 11 in a projection perpendicular to a plane direction of the first substrate 10.

The second chip further includes a second through hole structure 21. The second through hole structure 21 is disclosed in the second substrate 20, and is on a side of the fourth surface 205 of the second substrate 20. The projection image of the gap 30 falls within a projection image of the second through hole structure 21 in a projection perpendicular to a plane direction of the second substrate 20.

In an embodiment, the projection image of the first through hole structure 11 falls within a projection image of the first contact pad 120 in the projection perpendicular to the plane direction of the first substrate 10.

The projection image of the second through hole structure 21 falls within a projection image of the second contact pad 220 in the projection perpendicular to the plane direction of the second substrate 20.

In an embodiment, the first contact pad 120 is circular or rectangular in a projection perpendicular to a plane direction of the first substrate 10.

The second contact pad 220 is circular or rectangular in a projection perpendicular to a plane direction of the second substrate 20.

Specifically, as shown in FIG. 4A and FIG. 4B, in the embodiment shown in FIG. 4A, the first contact pad 120 is circular in the projection perpendicular to the plane direction of the first substrate 10. In the embodiment shown in FIG. 4B, the first contact pad 120 is rectangular in the projection perpendicular to the plane direction of the first substrate 10. It should be noted that the shape of the second contact pad 220 is the same as that of the first contact pad 120.

It should be noted that the first contact pad and the second contact pad may be, but are not limited to, circular or rectangular. In practice, the shapes of the first contact pad and the second contact pad may be determined by a photoetching process.

The above descriptions are merely the preferred embodiments of the present disclosure and are not intended to limit the scope of protection of the present disclosure. Any modifications, equivalent replacements, improvements and the like made within the spirit and principle of the present disclosure should be included within the scope of protection of the present disclosure.

What is claimed is:

1. A chip bonding method, comprising:
providing a first chip, wherein the first chip comprises a first substrate comprising a first surface and a second surface which are arranged to be opposite, and the first chip further comprises a first groove on a side of the first surface of the first substrate and a first contact pad in the first groove, the first contact pad comprises a first portion and a second portion, the first portion is lower than the first surface of the first substrate and the second portion is higher than the first surface of the first substrate, so as to form the first contact pad which is stepped;
providing a second chip, wherein the second chip comprises a second substrate comprising a third surface and a fourth surface which are arranged to be opposite, and the second chip further comprises a second groove on a side of the third surface of the second substrate and a second contact pad in the second groove, the second contact pad comprises a third portion and a fourth portion, the third portion is lower than the third surface of the second substrate and the fourth portion is higher than the third surface of the second substrate, so as to form the second contact pad which is stepped;
bonding the first chip and the second chip, wherein the first portion of the first chip contacts with the fourth portion of the second chip, and the second portion of the first chip contacts with the third portion of the second chip; and
forming a gap between the first contact pad and the second contact pad after bonding the first chip and the second chip;
wherein the first chip further comprises a first through hole structure, the first through hole structure is disposed in the first substrate, and is on a side of the second surface of the first substrate, and a projection image of the gap falls within a projection image of the first through hole structure in a projection perpendicular to a plane direction of the first substrate; wherein the first groove is disposed above the first through hole structure; and
wherein the second chip further comprises a second through hole structure, the second through hole structure is disposed in the second substrate, and is on a side of the fourth surface of the second substrate, and a projection image of the gap falls within a projection image of the second through hole structure in a projection perpendicular to a plane direction of the second substrate; wherein the second groove is disposed above the second through hole structure.

2. The method of claim 1, wherein
a side of a part of the second portion of the first contact pad is arc-shaped, and the part is higher than the first surface of the first substrate, and the side is close to the first substrate; and
a side of a part of the fourth portion of the second contact pad is arc-shaped, and the part is higher than the third surface of the second substrate, and the side is close to the second substrate.

3. The method of claim 1, wherein
the projection image of the first through hole structure falls within a projection image of the first contact pad in the projection perpendicular to the plane direction of the first substrate; and
the projection image of the second through hole structure falls within a projection image of the second contact pad in the projection perpendicular to the plane direction of the second substrate.

4. The method of claim 1, wherein
the first contact pad is circular or rectangular in a projection perpendicular to a plane direction of the first substrate; and
the second contact pad is circular or rectangular in a projection perpendicular to a plane direction of the second substrate.

5. The method of claim 1, wherein
a width of the first portion is larger than half of a width of the first contact pad and a width of the third portion is larger than half of a width of the second contact pad, in an extending direction of steps.

6. The method of claim 5, wherein
a height of a part of the second portion higher than the first portion ranges from 100 nm to 500 nm; and
a height of a part of the fourth portion higher than the third portion ranges from 100 nm to 500 nm.

7. The method of claim 1, wherein
the providing the first chip comprises:
forming the first substrate comprising a first base plate, a first through hole structure penetrating through the first base plate and a first dielectric layer covering upper surfaces of the first base plate and the first through hole structure;
etching the first substrate to form the first groove disposed above the first through hole structure;
filling the first groove to form a first contact pad pre-layer; and
etching a part of the first contact pad pre-layer to form the first contact pad; and
the providing the second chip comprises:
forming the second substrate comprising a second base plate, a second through hole structure penetrating through the second base plate and a second dielectric layer covering upper surfaces of the second base plate and the second through hole structure;
etching the second substrate to form the second groove disposed above the second through hole structure;
filling the second groove to form a second contact pad pre-layer; and
etching a part of the second contact pad pre-layer to form the second contact pad.

8. The method of claim 1, wherein
the bonding the first chip and the second chip comprises: bonding the first chip and the second chip up and down in a mirroring manner.

9. The method of claim 1, wherein
the forming the gap between the first contact pad and the second contact pad comprises: forming a gap between the second portion of the first contact pad and the fourth portion of the second contact pad.

10. A semiconductor chip structure, comprising:
a first chip comprising a first substrate comprising a first surface and a second surface which are arranged to be opposite, and the first chip further comprises a first groove on a side of the first surface of the first substrate and a first contact pad in the first groove;
a second chip comprising a second substrate comprising a third surface and a fourth surface which are arranged to be opposite, and the second chip further comprises a second groove on a side of the third surface of the second substrate and a second contact pad in the second groove; and
the first contact pad of the first chip contacts with the second contact pad of the second chip, and a gap is formed between the first contact pad and the second contact pad;
wherein the first chip further comprises a first through hole structure, the first through hole structure is disposed in the first substrate, and is on a side of the second surface of the first substrate, and a projection image of the gap falls within a projection image of the first through hole structure in a projection perpendicular to a plane direction of the first substrate; wherein the first groove is disposed above the first through hole structure; and
wherein the second chip further comprises a second through hole structure, the second through hole structure is disposed in the second substrate, and is on a side of the fourth surface of the second substrate, and a projection image of the gap falls within a projection image of the second through hole structure in a projection perpendicular to a plane direction of the second substrate; wherein the second groove is disposed above the second through hole structure.

11. The semiconductor chip structure of claim 10, wherein
a side of a part of the first contact pad is arc-shaped, and the part protrudes from the first surface of the first substrate, and the side is close to the first substrate; and
a side of a part of the second contact pad is arc-shaped, and the part protrudes from the third surface of the second substrate, and the side is close to the second substrate.

12. The semiconductor chip structure of claim 10, wherein
the projection image of the first through hole structure falls within a projection image of the first contact pad in the projection perpendicular to the plane direction of the first substrate; and
the projection image of the second through hole structure falls within a projection image of the second contact pad in the projection perpendicular to the plane direction of the second substrate.

13. The semiconductor chip structure of claim 10, wherein
the first contact pad is circular or rectangular in a projection perpendicular to a plane direction of the first substrate; and
the second contact pad is circular or rectangular in a projection perpendicular to a plane direction of the second substrate.

14. The semiconductor chip structure of claim 10, wherein
the first contact pad comprises a first portion and a second portion, the first portion is lower than the first surface of the first substrate and the second portion is higher than the first surface of the first substrate, so as to form the first contact pad which is stepped; and
the second contact pad comprises a third portion and a fourth portion, the third portion is lower than the third surface of the second substrate and the fourth portion is higher than the third surface of the second substrate, so as to form the second contact pad which is stepped.

* * * * *